(12) United States Patent
Louis et al.

(10) Patent No.: US 8,421,230 B2
(45) Date of Patent: Apr. 16, 2013

(54) MICROELECTRONIC DEVICE PROVIDED WITH AN ARRAY OF ELEMENTS MADE FROM A CONDUCTIVE POLYMER WITH A POSITIVE TEMPERATURE COEFFICIENT

(75) Inventors: Didier Louis, Coublevie (FR); Jean Du Port De Poncharra, Quaix En Chartreuse (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/377,274

(22) PCT Filed: Jun. 11, 2010

(86) PCT No.: PCT/EP2010/058252
§ 371 (c)(1), (2), (4) Date: Jan. 6, 2012

(87) PCT Pub. No.: WO2010/142793
PCT Pub. Date: Dec. 16, 2010

(65) Prior Publication Data
US 2012/0104615 A1    May 3, 2012

(30) Foreign Application Priority Data
Jun. 11, 2009  (FR) ...................................... 09 53908

(51) Int. Cl.
*H01L 23/52*        (2006.01)
(52) U.S. Cl.
USPC ............ 257/758; 257/E21.575; 257/E23.141; 438/622; 438/650

(58) Field of Classification Search .................. 257/750, 257/758, E23.141, E23.145, E21.575; 438/622, 438/637
See application file for complete search history.

(56) References Cited

U.S. PATENT DOCUMENTS

| | | | |
|---|---|---|---|
| 5,143,649 | A | 9/1992 | Blackledge et al. |
| 6,249,038 | B1 | 6/2001 | Daubenspeck et al. |
| 2001/0014509 | A1 | 8/2001 | Daubenspeck et al. |

(Continued)

FOREIGN PATENT DOCUMENTS

| | | |
|---|---|---|
| FR | 2 928 225 A1 | 9/2009 |
| WO | WO 02/091496 A2 | 11/2002 |
| WO | WO 2008/091648 A2 | 7/2008 |

OTHER PUBLICATIONS

French Search Report issued Jan. 15, 2010 in patent application No. FR 0953908 with English Translation of Category of Cited Documents.

(Continued)

*Primary Examiner* — Zandra Smith
*Assistant Examiner* — Paul Patton
(74) *Attorney, Agent, or Firm* — Oblon, Spivak, McClelland, Maier & Neustadt, L.L.P.

(57) ABSTRACT

Production of a device including: a substrate; multiple components forming an electronic circuit on the substrate; multiple superimposed metal levels of interconnections of the components, wherein the metal levels are located in at least one insulating layer resting on the substrate; and multiple elements made from a positive temperature coefficient conductive polymer material, wherein the elements traverse the insulating layer to a given depth, and are connected to at least one conductive line of a given interconnection level.

16 Claims, 7 Drawing Sheets

U.S. PATENT DOCUMENTS

| | | |
|---|---|---|
| 2004/0166669 A1 | 8/2004 | Saito |
| 2008/0180871 A1 | 7/2008 | Hebert et al. |
| 2009/0009926 A1 | 1/2009 | Baumgartner et al. |
| 2011/0101396 A1* | 5/2011 | Kim .............................. 257/98 |

OTHER PUBLICATIONS

International Search Report issued Jul. 23, 2010 in PCT/EP2010/058252.

Frank Owen, "Protect Your Circuits", Sensors, North American Technology, vol. 18, No. 3, XP008117093, Mar. 1, 2001, pp. 62-70.

Karin Kinsman, "PPTC Offers New Option for Circuit Protection", PCIM Power Electronic Systems, vol. 29, No. 7, XP008117091, Jul. 1, 2003, pp. 52-54.

Chiung-Chih Lin, at al., "A varistor-polymer composite with nonlinear electrical-thermal switching properties", Ceramics International, Elsevier Science, ltd., vol. 34, No. 1, XP002563242, Jan. 1, 2008, pp. 131-136.

Mitsuhiro Kataoka, at al., "PTC Characteristics of (TiC/Polyethylene) Conductive Composites in Relation to Their Particle-Filled Structures", Transactions of the Institute of Electrical Engineers of Japan, vol. 152, No. 2, XP002563243, pp. 1-9.

TDK Corporation, "Low-Resistance, Power-Saving, Miniature Type Polymer PTC Thermistors", TPS Series, 2008, pp. 1-5.

S. Bhattacharya, et al., "Electrical Properties of Graphite Filled Polymer Composites", $2^{nd}$ National Conference Mathematical Techniques: Emerging Paradigms for Electronics and IT Industries, Sep. 26-28, 2008, pp. 100-101.

* cited by examiner

MICROELECTRONIC DEVICE PROVIDED WITH AN ARRAY OF ELEMENTS MADE FROM A CONDUCTIVE POLYMER WITH A POSITIVE TEMPERATURE COEFFICIENT

TECHNICAL FIELD

The invention concerns the field of microelectronics and integrated circuits.

It provides for the production of a microelectronic device including one or more electronic circuits and interconnection elements forming at least one via intended to connect metal levels to one another, and to convey an electrical current.

These interconnection elements include a particular material to form means of protection against excess currents or heating phenomena in the device.

PRIOR ART

The document: "Low-resistance, power saving, miniature type polymer PTC thermistors" from the company TDK and dating from October 2003, presents an electronic device having a layer of a PTC conductive polymer (where PTC stands for Positive Temperature Coefficient), located between electrodes, and acting as protection against excess currents or overheating.

In the microelectronics field microelectronic devices generally have one or more integrated circuits including one or more metal interconnection levels, formed of horizontal conducting lines connected to one another by vertical conductive elements also called "vias".

In this field, systems providing protection for integrated circuits against excess current or overheating conditions are known.

Among these systems are single-action integrated fuses which are usually destroyed after a single use, i.e. on occurrence of an excess current.

The problem is posed of finding a new means of protection against excess currents integrated in a microelectronic device having one or more integrated circuits which is not restricted to a single use, and which satisfies criteria of minimal encumbrance and low cost of implementation.

ACCOUNT OF THE INVENTION

The invention firstly concerns a method for producing a microelectronic device including its manufacture through:

a) production on a substrate of one or more components of at least one electronic circuit, and of one or more metal levels of interconnection of the electronic circuit in at least one insulating layer, b) production of multiple interconnection elements orthogonal to the principal plane of the substrate, traversing said insulating layer, where said elements are made from a positive temperature coefficient conductive polymer material.

The interconnection elements made from a positive temperature coefficient conductive polymer material form protective means, for multiple uses, both against excess currents and against overheating of the device.

These interconnection elements can also play the role of reusable fuses, whether thermal and/or electrical.

The interconnection elements form a safety organ, enabling the electrical current between conductive pins or conductive zones to be discontinued or restricted, when the temperature exceeds a certain predetermined threshold, or when a current intended to traverse these elements exceeds a certain predetermined threshold.

The interconnection elements can be connected to the final metal level of said metal levels of interconnection of the components.

The interconnection elements can also be arranged in an array of X*Y interconnection elements (where X and/or Y are integers greater than 1), and including one or more vertical rows and one or more horizontal rows of interconnection elements.

According to one possibility, the array can be formed of multiple other interconnection elements orthogonal to the principal plane of the substrate, traversing said insulating layer, where said other elements are made from a material of the electronic circuit which can reach a temperature greater than the predetermined threshold when the device is operating within a given range of currents, can be made.

The elements made from a positive temperature coefficient conductive polymer material are then positioned in step b) in accordance with said localised heating zone.

The elements made from positive temperature coefficient conductive polymer can be formed on a first conductive zone, and be designed to connect electrically the first conductive zone to a second conductive zone. The method can include, prior to step b), or to step a), or to the manufacture of the device, a step of determining at least one maximum current intended to flow between the first conductive zone and the second conductive zone, when the device operates within a given range of temperatures, where the number of elements and the size of the elements made from a positive temperature coefficient conductive polymer formed in step b) depends on said determined maximum current value.

According to one aspect of the invention, it is possible to determine beforehand a threshold temperature value which must not be exceeded, whilst the device is in operation, for one or more components and/or for said multiple interconnection elements or for at least a portion of said multiple interconnection elements, and the number and/or the geometry (in particular at least the section or the length) of said interconnection elements is determined according to said temperature threshold value which must not be exceeded.

According to another aspect of the invention, it is possible to determine beforehand a maximum power rating which can be dissipated by the device, for example at a threshold temperature which must not be exceeded, whilst this device is in operation, and the number and/or the geometry (in particular at least the section or the length) of said interconnection elements are determined according to said maximum power value.

According to yet another aspect of the invention, it is possible to determine beforehand an acceptable current density which can traverse said multiple interconnection elements, whilst this device is in operation, and the number and/or geometry (in particular at least a section or the length) of said interconnection elements is determined according to said acceptable current density value.

The invention also concerns a microelectronic device including:
  a substrate,
  multiple components forming an electronic circuit on the substrate,
  multiple superimposed metal levels of interconnections of the components, where said metal levels are located in at least one insulating layer resting on the substrate,
  multiple vertical connection elements made from a positive temperature coefficient conductive polymer material, where said elements traverse the insulating layer to a given depth, and are connected to at least one conductive zone of a given interconnection level.

The elements can be connected to at least one other conductive zone of another interconnection level which is different from said given level.

The elements made from positive temperature coefficient conductive polymer material can be arranged in an array.

The array can include conductive elements made from a metal material.

The interconnection elements made from positive temperature coefficient conductive polymer can be connected to the final metal level of said metal interconnection levels.

The elements made from a positive temperature coefficient conductive polymer material can connect, and make an electrical connection between, a first conductive zone and a second conductive zone. The number and size of the interconnection elements made from a positive temperature coefficient conductive polymer material can then be chosen so as to:

restrict the current between the first conductive zone and a second conductive zone to a predetermined current value, and/or so as to restrict an operating temperature to a threshold temperature value which must not be exceeded, whilst the device is in operation, for one or more components and/or for said multiple interconnection elements or for at least a portion of said multiple interconnection elements, and/or so as to restrict the power which can be dissipated by the device at maximum power, for example to a threshold temperature which must not be exceeded, whilst this device is in operation, and/or so as to restrict an acceptable current density which can traverse the said multiple interconnection elements, when this device is in operation.

The elements made from positive temperature coefficient conductive polymer material can be arranged in the area of a predetermined localised heating zone of the electronic circuit.

BRIEF DESCRIPTION OF THE ILLUSTRATIONS

The present invention will be better understood on reading the description of examples of embodiment given, purely as an indication and in no sense restrictively, making reference to the annexed illustrations in which.

Identical, similar or equivalent parts of the various figures have the same numerical references, to make it easier to go from one figure to another.

The various parts represented in the figures are not necessarily represented at a uniform scale, in order to make the figures more readable.

DETAILED ACCOUNT OF PARTICULAR EMBODIMENTS

A first example of a microelectronic device implemented according to the invention will now be described.

This device is formed on the substrate, for which can for example being semiconducting, and includes one or more integrated electronic circuits, together with several superimposed levels of interconnections $M_1, \ldots M_n$, of the circuit or circuits.

Figure 1A:
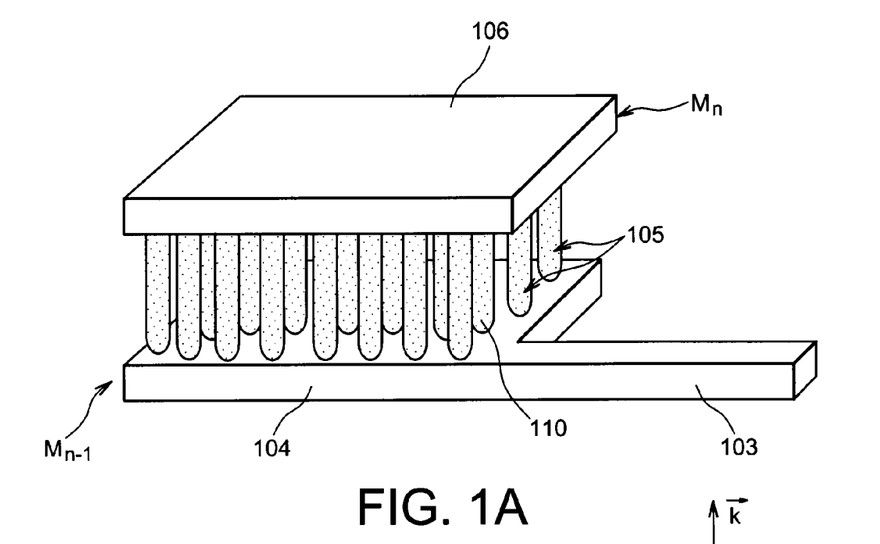
FIGS. 1A-1C give examples of microelectronic devices according to the invention, having an array of interconnection elements made from a conductive polymer material with a positive PTC.
Figure 1B:
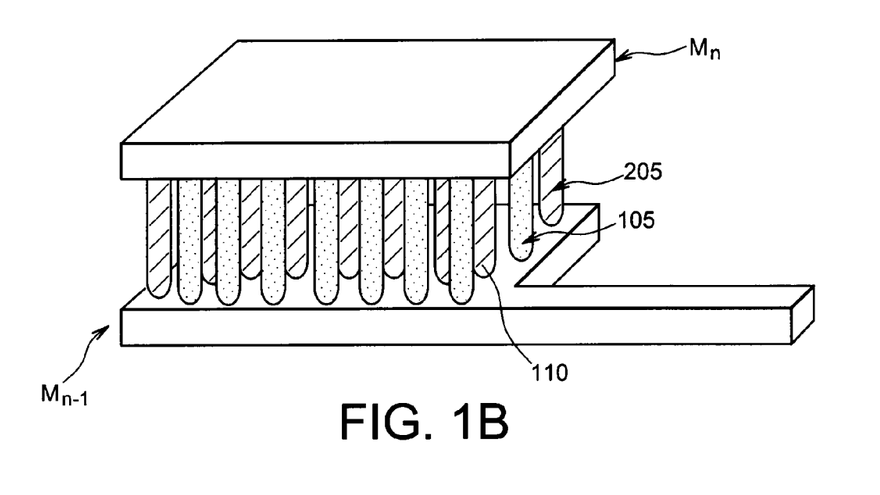
Figure 1C:
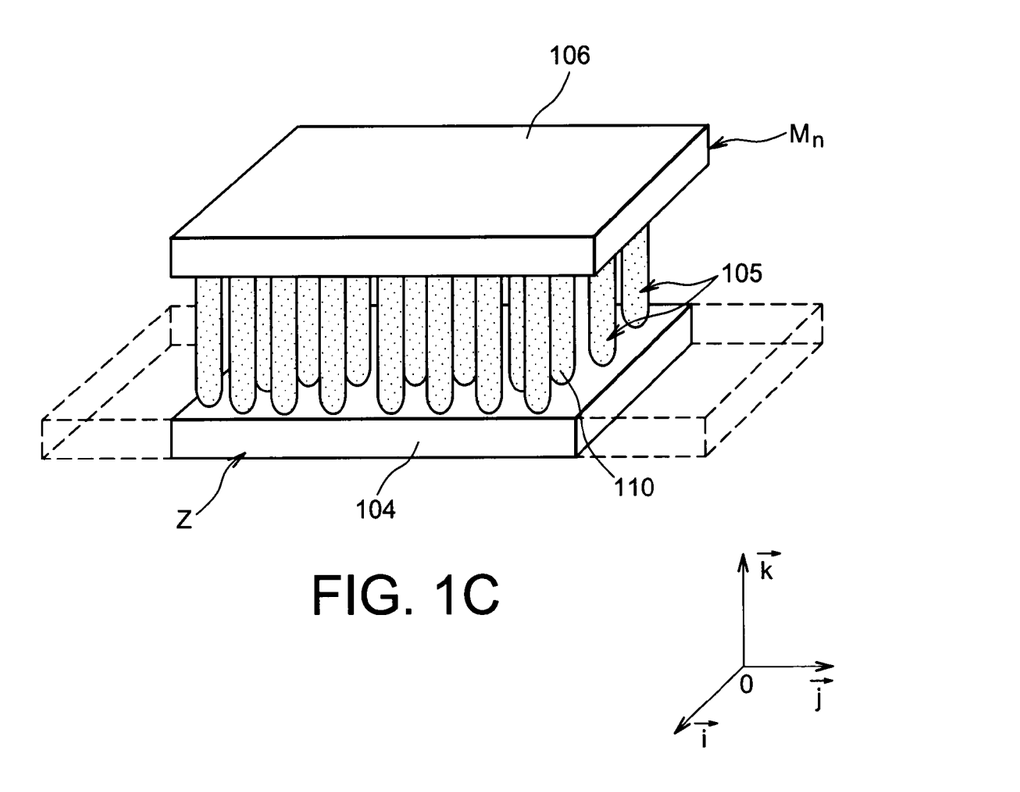

Each interconnection level $M_k$ can be formed of one or more horizontal connection elements, i.e. elements which are parallel or roughly parallel to the principal plane of the substrate (where the principal plane of the substrate is a plane parallel to plane $[0; \vec{i}; \vec{j}]$ of the orthogonal coordinate $[0; \vec{i}; \vec{j}; \vec{k}]$ given in FIGS. 1A-1C), and of one or more vertical connection elements, commonly called "vias", which are perpendicular or roughly perpendicular to the principal plane of the substrate.

The interconnection elements are located in one or more insulating layers formed on the substrate (the substrate and the insulating layer or layers are not represented in FIGS. 1A-1C).

In FIG. 1A a final metal interconnection level $M_n$ of a microelectronic device is represented and includes an array of X*Y vertical interconnection elements 105, intended to convey a current between a conductive pin 106 of final level $M_n$, i.e. the level furthest from the substrate, and another conductive pin 104 of a lower level, for example of the penultimate metal level $M_{n-1}$.

Conductive pin 106 of final level Mn can be connected to a horizontal metal line (unrepresented), which can, for example, be made from copper, while conductive pin 104 of penultimate level $M_{n-1}$ is connected to another horizontal metal line 103.

Interconnection elements 105 of the array of formed of a Positive Temperature Coefficient (or PTC) conductive polymer material 110.

The positive temperature coefficient conductive polymer material can be, for example, made from polyacethylen (PA), polythiophene (PT), poly(3-alkyl)thiophene, polypyrrole (PPy), or from polyaniline (PANi), and include particles such as conductive particles or carbon particles.

Interconnection elements 105 form protective means, with multiple uses, against excess currents, and against any overheating of the device.

Interconnection elements 105 can also play the role of reusable fuses, whether thermal and/or electrical.

Interconnection elements 105 form a safety organ, enabling the electrical current between pins 104 and 106 to be restricted or discontinued, when the temperature exceeds a certain predetermined threshold, or when a current intended to traverse these elements exceeds a certain predetermined threshold.

The number and size of vertical interconnection elements 105 made from material 110 are chosen, firstly, taking into account the conductance of the PTC polymer material to have a resistance less than or equal to that of a traditional metal pin and, secondly, so as to define a maximum current, which the array of elements is intended to prevent conveying between pins 105, 106, or which it is desired to accept as the highest possible current in conductive line 103; since the temperature depends on this maximum current it will be automatically restricted according to the critical temperature of the PTC conductive polymer.

The number and size of vertical interconnection elements 105 can also be chosen in accordance with a threshold temperature magnitude which it is desired must not be exceeded.

The temperature threshold magnitude also depends on the temperature resistivity curve inherent to the positive temperature coefficient conductive polymer material 110 which has been chosen.

Using an application such as, for example the ANSYS application from the company ANSOFT, it is possible to determine, by simulation, a maximum power rating able to be dissipated by the device with threshold temperature Tmax.

The power dissipated by elements 105 depends on a density of current traversing these elements. Thus, starting with an assessment of this current density, and if the resistivity profile of the PTC polymer is known, the height and section of interconnection elements 105 can be determined, and also the number of them.

In FIG. 1B a variant of the device of FIG. 1A is given.

In this example the array of connection elements includes alternating elements 105 made from the positive temperature coefficient conductive polymer material 110, and conductive elements 205 made from a metal material, for example such as copper, tungsten or aluminium.

In this case, elements 105 of the array are designed to convey a current and are able to act as reusable fuses, while the role of other elements 205 is to convey a current between pins 104 and 106.

In FIG. 1C, another variant of the device of FIGS. 1A and 1B is given. The array of connection elements includes vertical connection elements 105 made from a positive temperature coefficient conductive polymer material 110, located in a connection zone Z of a component, or connected to a component or a circuit, and which has been determined as a major heating zone of this component or this circuit.

The component can be, for example, a microprocessor or an analog circuit operating at a high frequency, or a live power source.

It is possible that zone Z can previously have been determined as a major heating zone by simulation, for example using an application such as the ANSYS application from the company ANSOFT, during which zones of the device which are subjected to the most heating, when the device is in operation, are identified. Zone Z can have been previously determined as a zone able to reach a certain range of temperatures for a given range of currents flowing in the device.

In this case, zone Z acts as a temperature sensor, the electrical resistance of which can be used by an independent regulating circuit.

In one or other of the examples of the device just given, a circuit controlling the resistance of array of elements 105 can be included. Such a control circuit can be designed to detect increases in resistance of the array due, for example, to an increase of the overall temperature. Such a circuit can be designed to restrict the power currents of an integrated circuit connected to the array of interconnection elements 105. Such a control circuit can be made, for example, using a diode or an integrated transistor.

Figure 2:
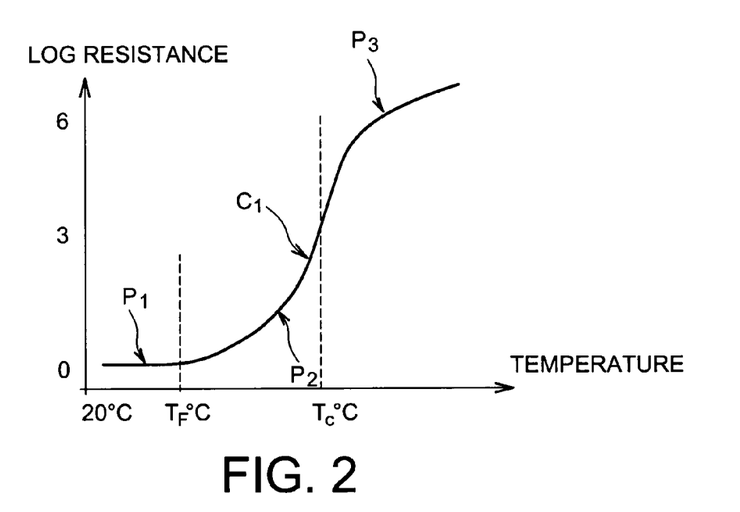
FIG. 2 illustrates an example resistivity curve of a conductive polymer material with positive PTC as a function of temperature.

An example of a resistivity curve of a positive temperature coefficient conductive polymer is given in FIG. 2.

In this figure graph $C_1$ depicting the variation of the resistance of the positive temperature coefficient conductive polymer is expressed in logarithmic units.

This graph includes a zone (portion $P_1$ of graph $C_1$) known as a "low resistivity" zone, in which, in the case of temperatures below a temperature $T_{F(°C.)}$ called the normal operating temperature, the conductive polymer has a low resistivity which changes only slightly in response to temperature changes.

This graph also includes a large zone of increase (portion $P_2$ of graph $C_1$) between temperature $T_{F(°C.)}$ and a temperature Tc(° C.), called the characteristic transition temperature, and also above temperature T° c. The polymer then includes (portion $P_3$ of graph $C_1$) a zone of high resistivity for temperatures greater than a temperature Tc(° C.).

Exceeding an acceptable current density causes the polymer to be heated. Since the temperature coefficient of the polymer's resistance is positive, the resistance of a connection element 105 formed from this polymer increases, which tends to cause the voltage to fall at the ends of connection elements 105, and to restrict the current and its current density traversing the array of elements 105. The temperature of connection elements 105 tends to decrease.

If the device is subject to a very high ambient temperature, for example of the order of 125° C. or 150° C. for a microprocessor, the current density traversing the array is restricted by the increased resistance of the polymer, and does not cause any additional heating.

The matrix of elements 105 can thus also operate as a thermal limiter and as a means of protection against a rapid rise in temperature.

The characteristic transition temperature Tc and the resistivity profile depend on the nature and composition of the polymer.

These parameters can be modified by modifying the content of conductive particles contained by the conductive polymer.

Characteristic transition temperature Tc and the resistivity profile of the PTC (Positive Temperature Coefficient) conductive polymer used can be modified to suit the application desired for the device described in connection with FIGS. 1A-1C.

Figure 3:
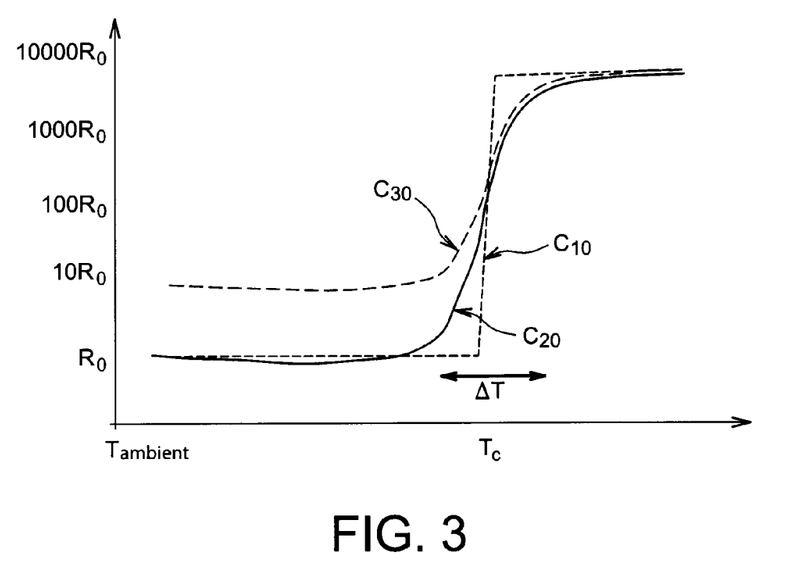
FIG. 3 gives different examples of resistivity curve as a function of temperature of different types of conductive polymer materials with positive PTC.

Different examples of resistivity profiles as a function of temperature, of 3 different positive temperature coefficient polymer materials, are given in FIG. 3.

The first profile example (graph $C_{10}$) is that of a first polymer having a low resistivity R0 when lower than temperature Tc, and a sudden transition from temperature Tc, changing from R0 to 10000*R0.

Such a polymer can provide a circuit breaker function where, if it reaches critical temperature Tc, it suddenly increases its resistivity such that it no longer conducts a current. A polymer such as polyethylene, ethylene, propylene-diene, or a terpolymer, with a carbon content, can have a profile of this type.

The second profile example (graph $C_{20}$) is that of a second polymer material having a low resistivity R0 and a more gradual transition than in the first example, such that an increase of resistivity, from R0 to 10000*R0, occurs within a temperature range ΔT of the order of 5° C.

The second material can provide temperature regulation. If such a material increases in temperature and reaches a temperature within the range ΔT, this leads to an increase of resistivity which then causes a reduction of the current of the array of connection elements formed from this material, which tends to cause a reduction in temperature.

The third profile example (graph $C_{30}$) is that of a third polymer material having a higher resistivity below the critical temperature Tc and a more gradual transition than in the previous two examples, such that an increase of resistivity, from 10*R0 to 10000*R0, occurs within a temperature range ΔT of the order of 5° C.

An array of elements made from such a polymer can provide temperature regulation. To form an array using such a polymer there can be a larger number of conductive elements 105 than for an array formed using the second polymer corresponding to the second profile example.

When the current density J traversing the array is such, or when the temperature of elements 105 is such, that temperature Tc is not reached, elements 105 conduct, and their resistivity varies only slightly.

When current density J traversing the array is such, or when the temperature of elements 105 is such, that transition temperature Tc is exceeded, this causes an increase of the resistance of the connection array, and the increase then creates a voltage drop and a reduction of the current density traversing the array and reaching pin 104, which creates a reduction in temperature of elements 105 of the array, until a thermal equilibrium is reached, in which the heating of elements 105 and the dissipation generated by these elements 105 balances out.

A method for production of a microelectronic device according to the invention, having multiple superimposed circuits and vertical interconnection elements called "super-vias" formed from a positive temperature coefficient conductive polymer, will now be described in connection with FIGS. 4A-4D.

Figure 4A:
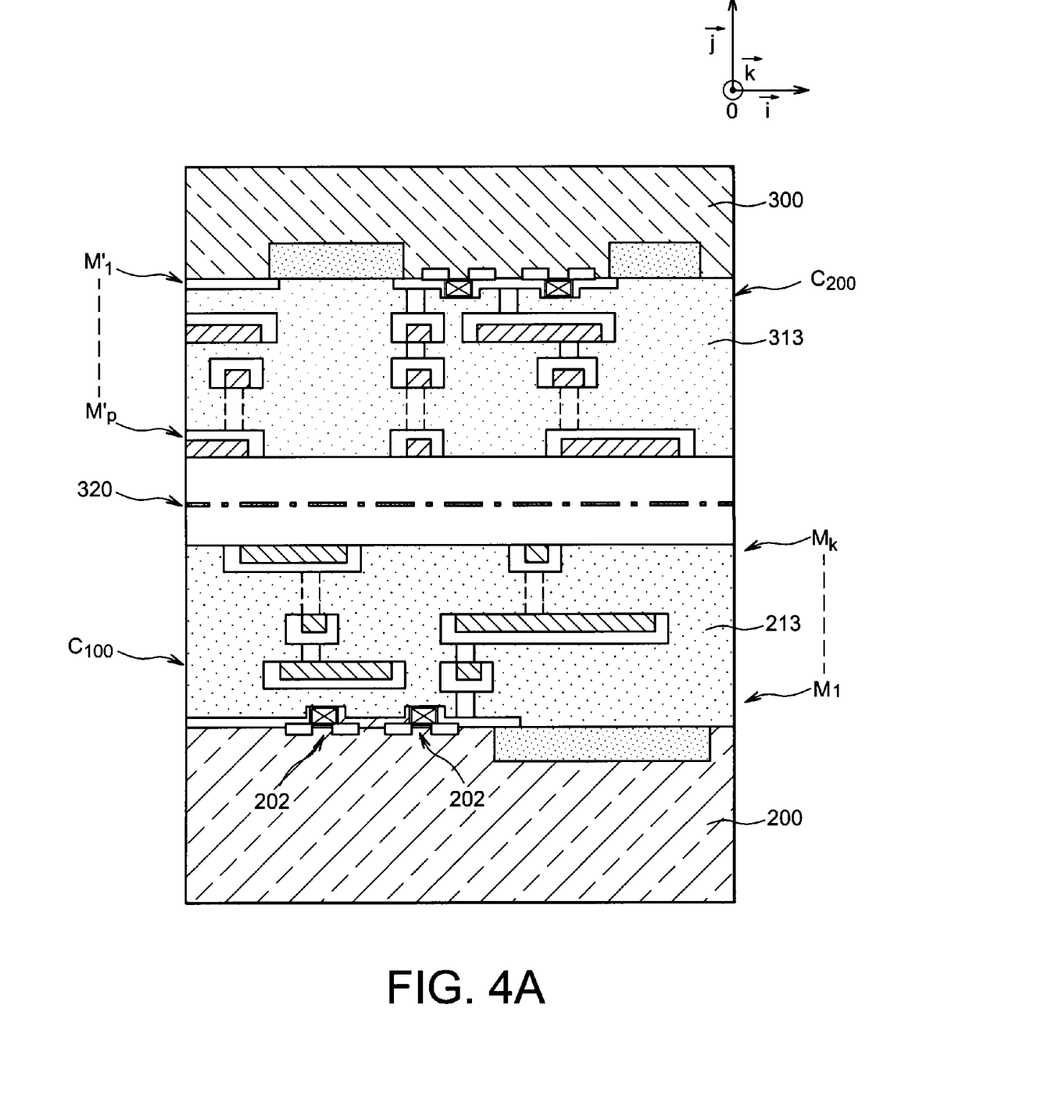
FIGS. 4A-4D illustrate an example method of production of a microelectronic device according to the invention.

A device is firstly produced which includes multiple superimposed integrated circuits.

The device thus includes at least one first circuit C100 and at least one second circuit C200, formed above the first circuit C100.

Circuits C100, C200 can be, for example, one or other of the following types: electronic, RF, optoelectronic, logical, memory, MEMS, one or more passive components.

The device which is produced can include at least a first circuit of a first type and at least a second circuit of a different type, chosen for example from among the abovementioned types of circuits.

First circuit C100 is formed on a substrate 200 and includes multiple components 202, for example notably transistors, together with multiple k metal levels M1, . . . , Mk of interconnection of the components produced in an insulating layer 213.

Second circuit C200 can be formed on a second substrate 300 and can also include multiple components 302, together with multiple p metal levels M'1, . . . , M'p of interconnection of components 302, located in an insulating layer 313.

First circuit C100 and second circuit C200 can be formed independently, and then assembled, for example by a method of flip-chip bonding in which second substrate 300 is reversed, both substrates 200, 300 are aligned relative to one another, and those circuits C100, C200 are then bonded, for example by molecular bonding, to one another.

A bonding interface 320, which can be formed from an insulating thickness, for example made from silicon oxide, separates the interconnections of both circuits C100 and C200 (FIG. 4A).

Second substrate 300 can then be made thinner, so as to reduce its thickness and to retain only a thickness which can be, for example, of the order of several micrometres, for example of the order of 15 µm to 30 µm.

Figure 4B:
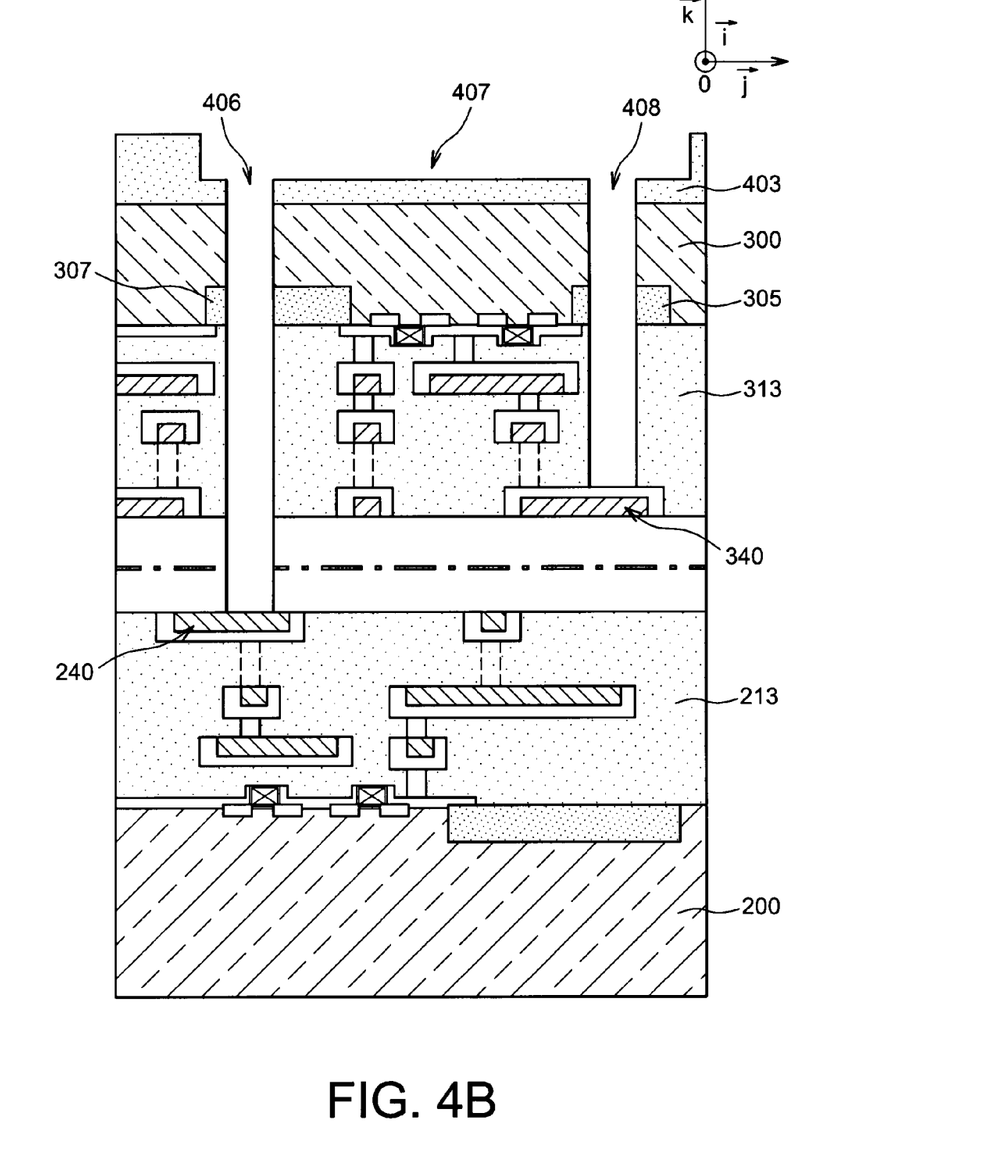

A layer of dielectric material 303, for example SiO$_2$, can then be produced on second substrate 200.

Apertures 406, 408 notably traversing the said second substrate 300, insulating layer 313 and bonding interface 220, are then formed (FIG. 4B).

Apertures 406, 408 can be produced, for example, by photolithography and etching, and emerge, respectively, in at least one metal zone 240 of first circuit C100 and in at least one metal zone 340 of second circuit C200.

One or more channels parallel to the principal plane of the substrate (defined in FIG. 4B as a plane passing through the substrate, and parallel to plane [O; $\vec{i}$; $\vec{j}$] of the orthogonal coordinate [O; $\vec{i}$; $\vec{j}$; $\vec{k}$]) can also be formed in the layer of dielectric material 403, one channel 407 of which revealing the opening of apertures 406 and 408.

Apertures 406, 408 can be positioned such that they traverse STI ("Shallow Trench Isolation") zones 305 of second circuit C200.

Apertures 406, 408 can have a diameter D (measured in FIG. 4B in a direction parallel to vector $\vec{j}$ of orthogonal coordinate [O; $\vec{i}$; $\vec{j}$; $\vec{k}$]) of between, for example, 1 and 5 µm or between 5 and 10 µm.

Apertures 406, 408 can also have a height H (measured in FIG. 4B in a direction parallel to vector $\vec{k}$ of orthogonal coordinate [O; $\vec{i}$; $\vec{j}$; $\vec{k}$]) of between, for example, 15 µm and 20 µm or between 15 µm and 30 µm.

Apertures 406, 408 can thus possibly be designed with larger dimensions than those of the vias of the traditional devices.

A fine insulating layer 433 is then formed on the walls of apertures 406, 408, so as to cover portions of second substrate 300 revealed by apertures 406, 407.

Such a fine insulating layer 433 can mean that it is possible to prevent a short-circuit of the vias intended to be produced in apertures 406, 408 with substrate 300.

Such a fine insulating layer 433 can be, for example, made from a dielectric such as SiO$_2$.

Figure 4C:
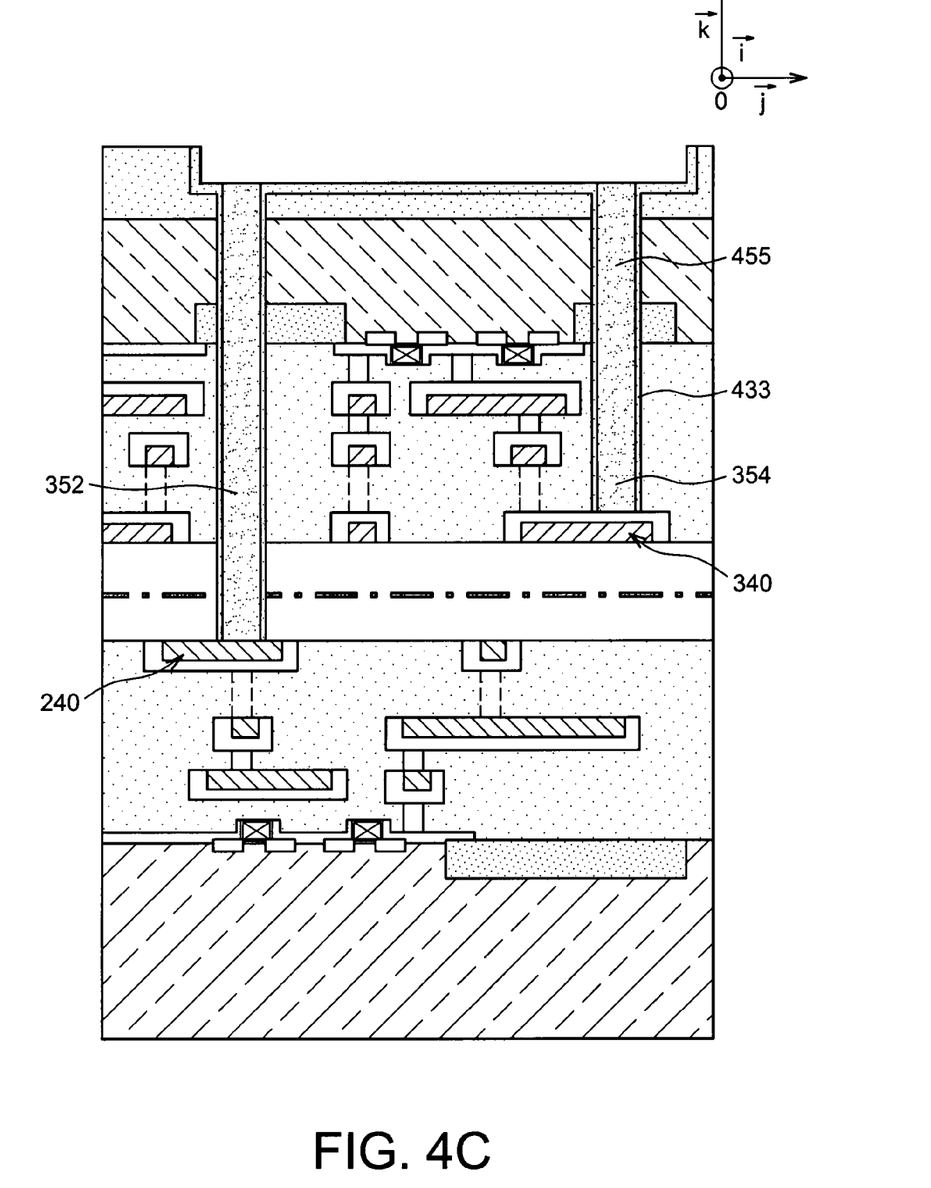

Apertures 406, 408 are then filled using a positive temperature coefficient conductive polymer material 455.

The positive temperature coefficient conductive polymer can be made from polyaniline or formed of a carbon-based organic material having natural conductive properties, or conductive properties obtained by doping.

Filling can be accomplished at a temperature of below 200° C.

The conductive polymer can, for example, be formed by CVD ("Chemical Vapour Deposition") or PVD ("Physical Vapour Deposition") deposition. The filling technique is modified to suit the size of apertures 406, 408 to be filled, and their shape.

In the case of form factors of between 5 and 10, the viscosity of the conductive polymer can be modified between 1 and $10^4$ Ctps, and up to form factors (ratio of height to width of the patterns), the viscosity of the polymer can be between $10^4$ and $10^5$ centipoises.

The filling can possibly be followed by a step of Chemical Mechanical Polishing, CMP.

A thermal annealing, or annealing by UV, can enable the deposited layer to be made to creep, and will eliminate the residual solvents, and can also enable the polymer's chemical structure to be reorganised.

With the deposition of such a polymer it is possible to guard against steps to produce a stack of layers such as diffusion barrier layers or bond coats when the interconnections are made from copper. Although it has a lower conductivity than copper the conductive polymer is particularly well-suited for the production of large vias, or vias with large aspect ratios.

After filling, a first interconnection element made from polymer material 455 was formed, the first opening reveals a first conductive zone 240 connected to one of the metal levels M1, . . . , Mk of the first circuit, and at least one second aperture reveals a second conductive zone 340 connected to one of metal levels M'1 . . . , M'p of second circuit C200, where the said filling leads to the formation of at least one first element 352 made from the given material 455 connected to first conductive zone 240 and at least one second element 354 made from the given material connected to second conductive zone 340.

Figure 4D:
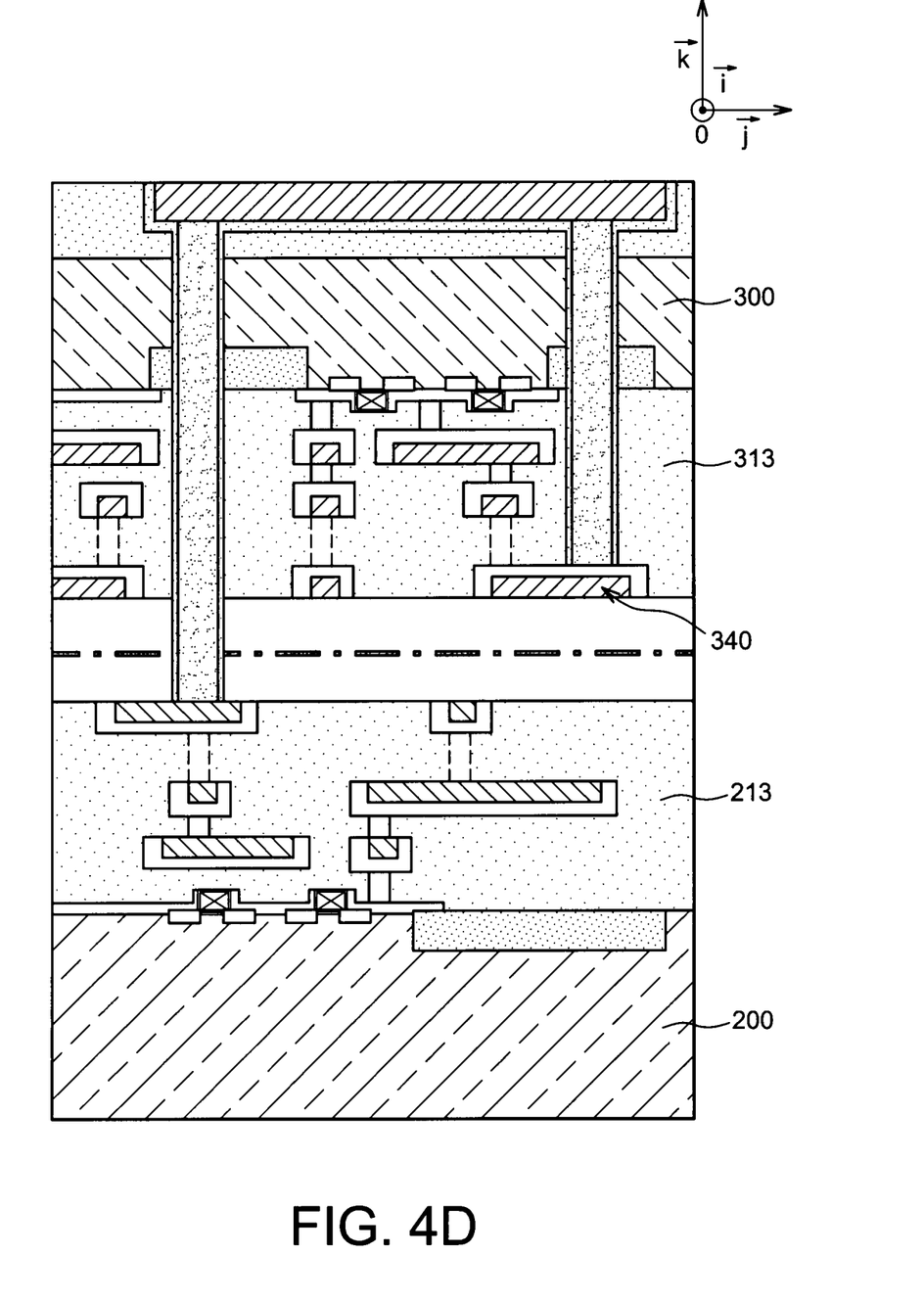

Channel 407 is then filled in using a metal material, for example such as copper (FIG. 4D).

In a device and a method according to the invention it is possible to use a metal (for example platinum) instead of the polymer as the PTC material.

In a device and a method according to the invention, this PTC material is placed inside the microelectronic chip, in a location of the chip where one of the components will for example heat. The PTC material enables its operation to be regulated by detecting and regulating the temperature.

The PTC material is used according to the invention at locations of the chip which require cooling, and/or temperature regulation and/or restriction. The size and number of the vias can be calculated by taking account of the conductance of the PTC material used, in order to obtain the activation threshold, in terms of the maximum acceptable current density or the maximum power dissipated in the lines to be protected.

According to the invention the PTC material is not used as a single-action fuse (i.e. when the fuse is activated the process cannot be reversed), but for its power-restoration properties, i.e. the initial state is regained if the protection is no longer necessary, i.e. once the temperature and/or the current density and/or the dissipated power return to a value below the corresponding threshold value. Once again, the material is integrated in the chip and deposited where it will enable action to be taken to prevent overheating.

The threshold temperature magnitude (or dissipated power or current density magnitude) also depends on the temperature resistivity curve inherent to the PTC material which has been chosen.

According to the invention it is possible to determine by simulation a maximum power which can be dissipated by the device at a threshold temperature Tmax.

The power dissipated by elements 105 depends on a density of current traversing these elements. Thus, starting with an assessment of this current density, and if the resistivity profile of the PTC material is known, the height and section of interconnection elements 105 can be determined, and also the number of them.

The invention claimed is:

1. A method for production of a microelectronic device, comprising:
   a) producing on a substrate one or more components of at least one electronic circuit, and of one or more metal levels of interconnection of the electronic circuit in at least one insulating layer;
   b) producing multiple interconnection elements orthogonal to a principal plane of the substrate, traversing the insulating layer, wherein the elements are made from a positive temperature coefficient conductive polymer material; and
   prior to the producing b), or to the producing a), or to manufacture of the device, determining at least one localized zone of heating of the electronic circuit that can reach a temperature higher than a predetermined threshold when the device is operating within a given current range; and
   wherein the elements are positioned in the producing b) in accordance with the at least one localized heating zone.

2. A method according to claim 1, wherein the interconnection elements are connected to a final metal layer from among the metal layers of interconnection of the components.

3. A method according to claim 1, wherein the interconnection elements are arranged in an array.

4. A method according to claim 1, wherein the array is formed from multiple other interconnection elements that are orthogonal to the principal plane of the substrate, traversing the insulating layer, wherein the other elements are made from a metal material.

5. A method according to claim 1, wherein the elements made from positive temperature coefficient conductive polymer are formed in a first conductive zone, and configured to connect electrically the first conductive zone to a second conductive zone,
   wherein the method further comprises, prior to the producing b), or the producing a), or to the manufacture of the device, determining at least one maximum current to flow between the first conductive zone and the second conductive zone, when the device is operating within a given range of temperatures, and wherein a number of elements and a size of the elements made from positive temperature coefficient conductive polymer, formed in the producing b), are chosen according to the value.

6. A method according to claim 1, wherein a threshold temperature value which must not be exceeded for one or more components, or for at least a portion of the multiple interconnection elements, is determined beforehand, and wherein a number and/or geometry of the interconnection elements is determined according to the threshold temperature value.

7. A method according to claim 1, wherein a maximum power be dissipated by the device during operation of the device is determined beforehand, and a number and/or geometry of the interconnection elements is determined according to the maximum power value.

8. A method according to claim 1, wherein an acceptable current density that can traverse the multiple interconnection elements during operation of the device is determined beforehand, and a number and/or geometry of the interconnection elements is determined according to the acceptable current density value.

9. A microelectronic device comprising:
   a substrate;
   multiple components forming an electronic circuit on the substrate;
   one or more superimposed metal levels of interconnections of the components, wherein the metal levels are located in at least one insulating layer resting on the substrate; and
   multiple interconnection elements orthogonal to a principal plane of the substrate and made from a positive temperature coefficient conductive polymer material, wherein the elements traverse a thickness of the insulating layer and are connected to at least one conductive line of a given interconnection level, and wherein the elements made from a positive temperature coefficient conductive polymer material are positioned in a predetermined localized heating zone of the electronic circuit.

10. A device according to claim 9, wherein the elements made from positive temperature coefficient conductive polymer material are arranged in an array.

11. A device according to claim 9, wherein the array also includes conductive elements made from a metal material.

12. A device according to claim 9, wherein the interconnection elements made from positive temperature coefficient conductive polymer are connected to the final metal level from among the metal interconnection levels.

13. A device according to claim 9, wherein the elements made from a positive temperature coefficient conductive polymer material link connect electrically a first conductive zone and a second conductive zone, wherein a number and size of the interconnection elements made from positive temperature coefficient conductive polymer material are chosen:
   so as to restrict current between the first conductive zone and a second conductive zone to a predetermined current value;

and/or so as to restrict an operating temperature to a threshold temperature value that must not be exceeded, whilst the device is in operation, for one or more components and/or for the multiple interconnection elements or for at least a portion of the multiple interconnection elements;
and/or to restrict power that can be dissipated by the device at maximum power, or to a threshold temperature that must not be exceeded, whilst this device is in operation;
and/or to restrict an acceptable current density that can traverse the multiple interconnection elements, when the device is in operation.

14. A device according to claim 9, further comprising a circuit for controlling resistance of the interconnection elements.

15. A device according to claim 14, wherein the control circuit enables increases in resistance of the interconnection elements due to an increase of overall temperature to be detected.

16. A device according to claim 14, wherein the control circuit enables power currents of an integrated circuit connected to the interconnection elements to be restricted.

* * * * *